US011348986B2

(12) United States Patent
Lee et al.

(10) Patent No.: US 11,348,986 B2
(45) Date of Patent: May 31, 2022

(54) DISPLAY APPARATUS HAVING A LIGHT-EMITTING DEVICE

(71) Applicant: LG Display Co., Ltd., Seoul (KR)

(72) Inventors: Seong-Joo Lee, Goyang-si (KR); Jung-Ho Bang, Paju-si (KR); Jung-Sun Beak, Paju-si (KR); Sun-Mi Lee, Paju-si (KR); Tae-Hwan Kim, Goyang-si (KR); Hyeon-Chul Im, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/122,803

(22) Filed: Dec. 15, 2020

(65) Prior Publication Data

US 2021/0134891 A1 May 6, 2021

Related U.S. Application Data

(63) Continuation of application No. 16/713,728, filed on Dec. 13, 2019, now Pat. No. 10,910,457.

(30) Foreign Application Priority Data

Dec. 14, 2018 (KR) ........................ 10-2018-0161646

(51) Int. Cl.

| | |
|---|---|
| ***G09G 3/30*** | (2006.01) |
| ***H01L 27/32*** | (2006.01) |
| ***G02F 1/1335*** | (2006.01) |

(52) U.S. Cl.

CPC ...... *H01L 27/326* (2013.01); *G02F 1/133514* (2013.01); *H01L 27/3246* (2013.01); *G02F 1/133519* (2021.01)

(58) Field of Classification Search

CPC ............. G02F 1/1335; G02F 1/133514; G02F 1/133519; H01L 27/32; H01L 27/322; H01L 27/3246; H01L 27/3258; H01L 27/326; H01L 27/3262; H01L 27/3276; H01L 27/124; H01L 27/1248

See application file for complete search history.

(56) References Cited

U.S. PATENT DOCUMENTS

| | | | | |
|---|---|---|---|---|
| 6,864,935 | B2 | 3/2005 | Kim et al. | |
| 7,816,693 | B2 | 10/2010 | Inoue et al. | |
| 7,839,081 | B2 * | 11/2010 | Kubota | H01L 27/3244 313/506 |
| 8,711,310 | B2 | 4/2014 | Lee et al. | |
| 10,084,029 | B2 | 9/2018 | Lee et al. | |
| 10,388,838 | B2 * | 8/2019 | Hung | H01L 33/0075 |
| 10,608,060 | B2 | 3/2020 | Kim et al. | |
| 10,910,457 | B2 * | 2/2021 | Lee | H01L 27/326 |
| 2006/0125407 | A1 | 6/2006 | Jeong | |
| 2006/0132383 | A1 * | 6/2006 | Gaily | G09G 3/3466 345/32 |

(Continued)

*Primary Examiner* — Joe H Cheng

(74) *Attorney, Agent, or Firm* — Seed IP Law Group LLP

(57) ABSTRACT

A display apparatus including two lines is provided. The two lines may extend in a first direction. A light-emitting device may be disposed between the two lines. Each line may be bent or extended in the direction of the device substrate which supports the light-emitting device. Thus, in the display apparatus, mixing of light emitted to the outside through the device substrate may be prevented. Therefore, in the display apparatus, the quality of realized image may be improved.

15 Claims, 10 Drawing Sheets

(56) References Cited

U.S. PATENT DOCUMENTS

2007/0194699 A1 8/2007 Lee et al.
2007/0200995 A1 8/2007 Jang
2008/0137022 A1 6/2008 Komeno et al.
2009/0091671 A1 4/2009 Tsubata et al.
2009/0103304 A1* 4/2009 Kobayashi .......... H01L 51/5281 362/293
2010/0038642 A1 2/2010 Choi et al.
2010/0060842 A1 3/2010 Igeta et al.
2010/0078656 A1* 4/2010 Seo .................... H01L 25/0753 257/88
2010/0271582 A1 10/2010 Yamakawa et al.
2010/0289040 A1* 11/2010 Seo .................... H01L 25/0753 257/91
2011/0081737 A1* 4/2011 Wu ........................ H01L 33/46 438/29
2012/0261681 A1* 10/2012 Ooyabu .................. H01L 24/97 257/88
2014/0306241 A1* 10/2014 Hirakata ............... H01L 27/322 257/79
2015/0108434 A1 4/2015 Tian et al.
2015/0373848 A1 12/2015 Seek
2016/0054363 A1 2/2016 Rostron et al.
2016/0064612 A1* 3/2016 Ren .................. G02F 1/133603 349/62
2016/0276320 A1* 9/2016 Hung .................. H01L 25/0655
2016/0284250 A1* 9/2016 Fujita ..................... G09F 13/10
2017/0288095 A1* 10/2017 Cheng ..................... H01L 33/44
2017/0294417 A1* 10/2017 Edmond ................. H01L 33/60
2018/0151120 A1* 5/2018 Kim .................... H01L 27/3244
2018/0151645 A1* 5/2018 Lee ..................... H01L 27/3244
2020/0088921 A1* 3/2020 Yang ................. G02F 1/133617
2020/0136091 A1 4/2020 Kang et al.
2020/0241686 A1 7/2020 Kim et al.
2021/0028329 A1* 1/2021 Wu ......................... H01L 33/06
2021/0091152 A1* 3/2021 Yang ................... H01L 27/3248

* cited by examiner

DISPLAY APPARATUS HAVING A LIGHT-EMITTING DEVICE

CROSS-REFERENCE TO RELATED APPLICATIONS

This application is a continuation of U.S. patent application Ser. No. 16/713,728, filed Dec. 13, 2019, now U.S. Pat. No. 10,910,457 B2, which claims the priority benefit of Korean Patent Application No. 10-2018-0161646, filed Dec. 14, 2018, which is hereby incorporated by reference as if fully set forth herein.

BACKGROUND

Technical Field

The present disclosure relates to a display apparatus including a light-emitting device disposed in a unit pixel.

Description of the Related Art

Generally, an electronic appliance, such as a monitor, a TV, a laptop computer, a smart watch and a digital camera, includes a display apparatus to realize an image. For example, the display apparatus may include a liquid crystal display device and a light-emitting display device.

The display apparatus may include a plurality of unit pixel. Each of the unit pixels may emit light displaying a color different from adjacent unit pixel. For example, a light-emitting device may be disposed in each unit pixel. The light-emitting device may include a first electrode, a light-emitting layer, and a second electrode, which are generally sequentially stacked.

A driving circuit may be disposed in each unit pixel. The driving circuit may control the light-emitting device of the corresponding unit pixel. For example, each of the unit pixels may include an emitting region in which the light-emitting device is disposed, and a driving region in which the driving circuit is disposed. The display apparatus may include signal lines for transmitting a signal to the driving circuit of each unit pixel. For example, each of the unit pixels may be disposed between the signal lines.

BRIEF SUMMARY

When the light-emitting device is operational, the light emitted from the light-emitting device of each unit pixel may travel in a direction of adjacent unit pixels (e.g., the emitted light may travel laterally in the direction of the adjacent unit pixels). In these cases, color mixed due to overlapping of light may occur, and the quality of realized image in the display apparatus may be degraded. Accordingly, the present disclosure is directed to a display apparatus that substantially obviates one or more problems due to limitations and disadvantages of the related art.

The present disclosure provides a display apparatus capable of preventing mixing color due to overlapping light.

The present disclosure further provides a display apparatus capable of blocking light traveling in the direction of adjacent unit pixels.

Additional advantages, and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve these advantages and in accordance with the disclosure, as embodied and broadly described herein, there is provided a display apparatus comprising an intermediate insulating layer on a device substrate. The intermediate insulating layer includes a first intermediate penetrating hole and a second intermediate penetrating hole. The second intermediate penetrating hole is spaced away from the first intermediate penetrating hole. A first signal line is disposed on the intermediate insulating layer. The first signal line includes a portion disposed in the first intermediate penetrating hole. A second signal line is spaced away from the first signal line. The second signal line includes a portion disposed in the second intermediate penetrating hole. An over-coat layer is disposed on the intermediate insulating layer. The over-coat layer covers the first signal line and the second signal line. A light-emitting device is disposed on the over-coat layer. The light-emitting device overlaps a region disposed between the first signal line and the second signal line.

A color filter may be disposed between the intermediate insulating layer and the over-coat layer. The color filter may overlap the light-emitting device.

The first signal line may cover a sidewall of the first intermediate penetrating hole toward the second intermediate penetrating hole. The second signal line may cover a sidewall of the second intermediate penetrating hole toward the first intermediate penetrating hole.

The first signal line may include an end portion disposed in the first intermediate penetrating hole. The second signal line may include an end portion disposed in the second intermediate penetrating hole.

The first signal line may be in contact with the device substrate in the first intermediate penetrating hole. The second signal line may be in contact with the device substrate in the second intermediate penetrating hole.

A lower insulating layer may be disposed between the device substrate and the intermediate insulating layer. The lower insulating layer may include a first lower penetrating hole and a second lower penetrating hole. The first lower penetrating hole may overlap the first intermediate penetrating hole. The second lower penetrating hole may overlap the second intermediate penetrating hole.

An upper insulating layer may be disposed between the intermediate insulating layer and over-coat layer. The upper insulating layer may include a first upper penetrating hole and a second upper penetrating hole. The first upper penetrating hole may be disposed between the first intermediate penetrating hole and the first signal line. The second upper penetrating hole may be disposed between the second intermediate penetrating hole and the second signal line.

A bank insulating layer may be disposed on the over-coat layer. The bank insulating layer may cover an edge of a lower electrode of the light-emitting device. The first intermediate penetrating hole and the second intermediate penetrating hole may overlap the bank insulating layer.

In another embodiment, a display apparatus includes a data line extending in a first direction. A power supply line extends in the first direction. The power supply line is spaced away from the data line. A unit pixel is disposed between the data line and the power supply line. The unit pixel includes an emitting region and a driving region. The emitting region and the driving region are disposed side by side in the first direction. A first penetrating hole overlaps a portion of the data line. A second penetrating hole overlaps a portion of the power supply line. A distance of the first penetrating hole and a distance of the second penetrating hole in the first direction are smaller than a distance of the unit pixel in the first direction.

The distance of the first penetrating hole and the distance of the second penetrating hole in the first direction may be larger than a distance of the emitting region in the first direction.

The distance of the second penetrating hole in the first direction may be the same as the distance of the first penetrating hole in the first direction.

A distance of the first penetrating hole in a second direction perpendicular to the first direction may be smaller than a distance of the data line in the second direction. A distance of the second penetrating hole in the second direction may be smaller than a distance of the power supply line in the second direction.

Each of the data line and the power supply line may include a first region in the corresponding penetrating hole, and a second region on the first region. A thickness of the second region may be larger than a thickness of the first region.

The second region may include a material different from the first region.

The first penetrating hole may be filled by the first region of the data line. The second penetrating hole may be filled by the first region of the power supply line.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
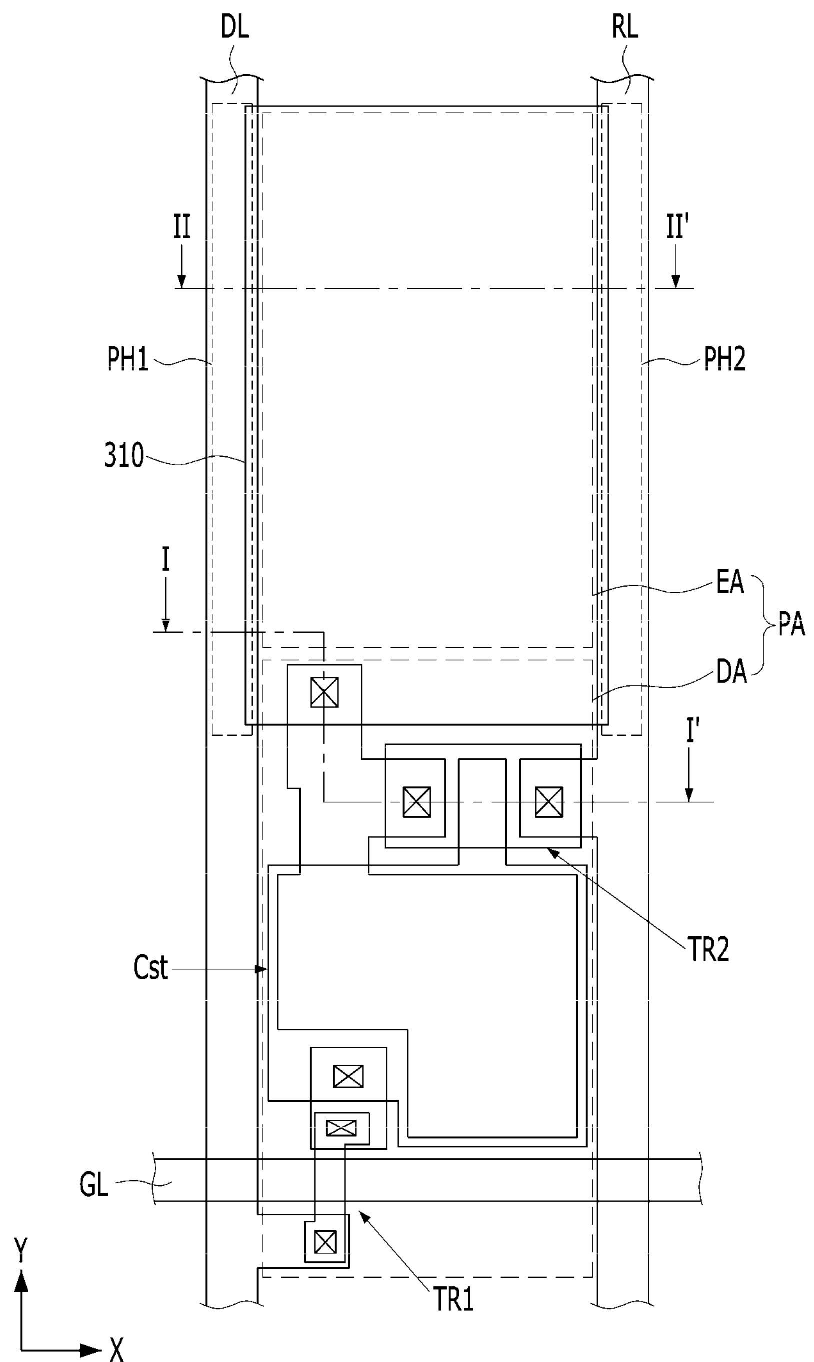
FIG. 1 is a view schematically showing a display apparatus according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 2A:
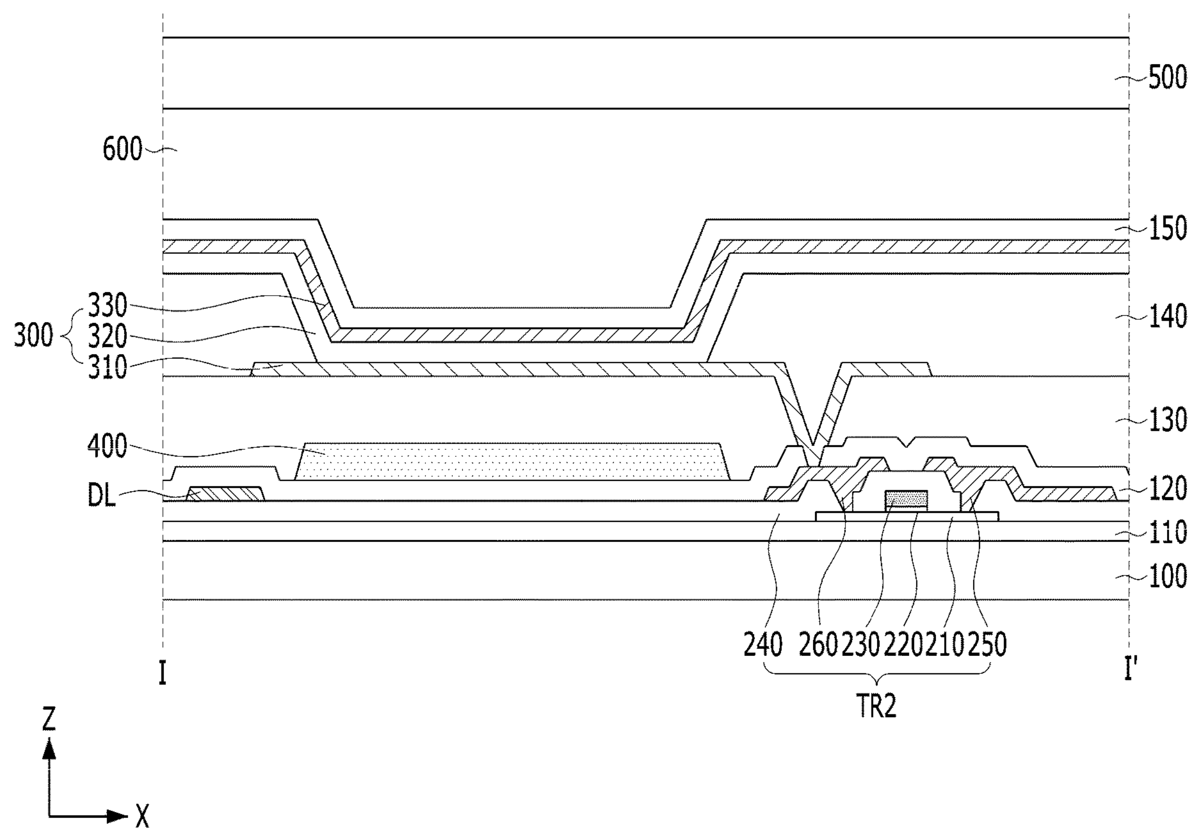
FIG. 2A is a view taken along I-I' of FIG. 1.
Figure 2B:
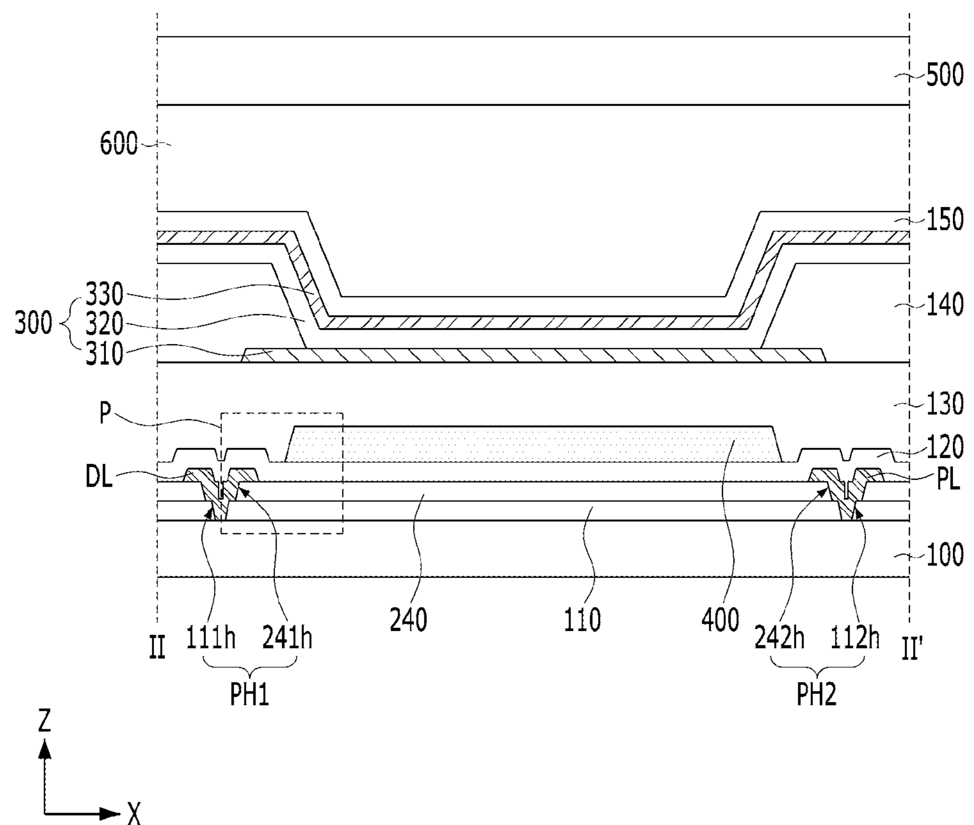
FIG. 2B is a view taken along II-II' of FIG. 1.
Figure 3:
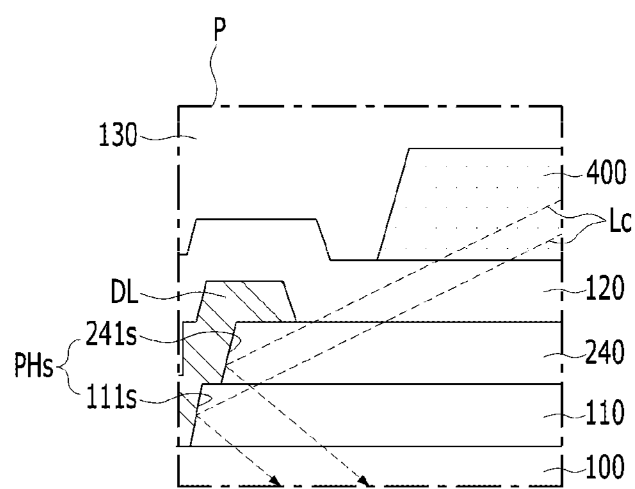
FIG. 3 is an enlarged view of P region in FIG. 2B.

FIG. 1 is a view schematically showing a display apparatus according to an embodiment of the present disclosure. FIG. 2A is a view taken along I-I' of FIG. 1. FIG. 2B is a view taken along II-II' of FIG. 1. FIG. 3 is an enlarged view of P region in FIG. 2B.

Referring to FIGS. 1 to 3, the display apparatus according to the embodiment of the present disclosure may include a device substrate 100. The device substrate 100 may include an insulating material. The device substrate 100 may include a transparent material. For example, the device substrate 100 may include glass or plastic.

Signal lines GL, DL and PL may be disposed on the device substrate 100. For example, a data line DL and a power supply line PL which extend in a first direction Y, and a gate line GL extending in a second direction X transverse to the first direction Y may be disposed on the device substrate 100. In one or more embodiments, the data line DL and the power supply line PL may be perpendicular to the gate line GL. The gate line GL may overlap the data line DL and the power supply line PL. The power supply line PL may be spaced away from the data line DL.

The signal lines GL, DL and PL may be used to form a plurality of unit pixels PA. Each of the unit pixels PA may be adjacent to the signal lines GL, DL and PL. In some examples, each of the unit pixels PA may be disposed along the data line DL, the power supply line PL and the gate line GL.

Each of the unit pixels PA may emit light displaying a specific color. For example, a driving circuit connected to the signal lines GL, DL and PL, and a light-emitting device 300 controlled by the driving circuit may be disposed in the each unit pixel PA.

The driving circuit may apply a driving current to the light-emitting device 300 according to signals transmitted through the signal lines GL, DL and PL. For example, the driving circuit may include a first thin film transistor TR1, a second thin film transistor TR2, and a storage capacitor Cst.

The first thin film transistor TR1 may turn on or off the second thin film transistor TR2 according to a signal transmitted through the signal lines GL, DL and PL. The second thin film transistor TR2 may transmit the driving current according to the signal of the first thin film transistor TR1 to the light-emitting device 300. The storage capacitor Cst may maintain the operation of the second thin film transistor TR2 according to the signal of the first thin film transistor TR1 during a single frame.

The first thin film transistor TR1 and the second thin film transistor TR2 may include substantially the same structure. For example, the first thin film transistor TR1 and the second thin film transistor TR2 may respectively include a semiconductor pattern 210, a gate insulating layer 220, a gate electrode 230, an interlayer insulating layer 240, a source electrode 250, and a drain electrode 260, which are disposed on the device substrate 100.

The semiconductor pattern 210 may be disposed close to the device substrate 100. The semiconductor pattern 210 may include a semiconductor material. For example, the semiconductor pattern 210 may include amorphous silicon or poly-silicon. The semiconductor pattern 210 may be an oxide semiconductor. For example, the semiconductor pattern 210 may include indium gallium zinc oxide (IGZO).

The semiconductor pattern 210 may include a source region, a drain region, and a channel region. The channel region may be disposed between the source region and the drain region. The channel region may have an electrical conductivity lower than the source region and the drain region. For example, impurity concentrations of the source region and the drain region may be higher than that of the channel region.

The gate insulating layer 220 may be disposed on a portion of the semiconductor pattern 210. For example, the gate insulating layer 220 may be disposed on the channel region of the semiconductor pattern 210. The source region and the drain region of the semiconductor pattern 210 may be exposed by the gate insulating layer 220.

The gate insulating layer 220 may include an insulating material. For example, the gate insulating layer 220 may include silicon oxide (SiO) or silicon nitride (SiN). The gate insulating layer 220 may have a multi-layer structure. The gate insulating layer 220 may include a high-K material. For example, the gate insulating layer 220 may include hafnium oxide (HfO) or titanium oxide (TiO).

The gate electrode 230 may be disposed on the gate insulating layer 220. The gate electrode 230 may be insulated from the semiconductor pattern 210 by the gate insulating layer 220. For example, the gate electrode 230 may overlap the channel region of the semiconductor pattern 210.

The gate electrode 230 may include a conductive material. For example, the gate electrode 230 may include a metal, such as aluminum (Al), chrome (Cr), molybdenum (Mo) and tungsten (W).

The interlayer insulating layer 240 may be disposed on the semiconductor pattern 210 and the gate electrode 230. The interlayer insulating layer 240 may be extended beyond the semiconductor pattern 210. For example, the interlayer insulating layer 240 of the second thin film transistor TR2 may be coupled to the interlayer insulating layer 240 of the first thin film transistor TR1. A side surface of the semiconductor pattern 210 and a side surface of the gate electrode 230 may be covered by the interlayer insulating layer 240.

The interlayer insulating layer 240 may include an insulating material. For example, the interlayer insulating layer 240 may include silicon oxide (SiO).

The source electrode 250 may be disposed on the interlayer insulating layer 240. The source electrode 250 may be electrically connected to the source region of the semiconductor pattern 210. For example, the interlayer insulating layer 240 may include a contact hole partially exposing the source region of the semiconductor pattern 210. The source electrode 250 may include a region overlapping with the source region of the semiconductor pattern 210.

The source electrode 250 may include a conductive material. For example, the source electrode 250 may include a metal, such as aluminum (Al), chrome (Cr), molybdenum (Mo), and tungsten (W). The source electrode 250 may include a conductive material different from the gate electrode 230.

The drain electrode 260 may be disposed on the interlayer insulating layer 240. The drain electrode 260 may be spaced away from the source electrode 250. The drain electrode 260 may be electrically connected to the drain region of the semiconductor pattern 210. For example, the interlayer insulating layer 240 may include a contact hole partially exposing the drain region of the semiconductor pattern 210. The drain electrode 260 may include a region overlapping with the drain region of the semiconductor pattern 210.

The drain electrode 260 may include a conductive material. For example, the drain electrode 260 may include a metal, such as aluminum (Al), chrome (Cr), molybdenum (Mo), and tungsten (W). The drain electrode 260 may include the same or substantially the same material as the source electrode 250. The drain electrode 260 may include a conductive material different from the gate electrode 230.

The first thin film transistor TR1 may be turned on by the gate line GL. For example, the gate electrode 230 of the first thin film transistor TR1 may be electrically connected to the gate line GL. The gate line GL may include the same or substantially the same material as the gate electrode 230 of the first thin film transistor TR1. For example, the gate electrode 230 of the first thin film transistor TR1 may be a part of the gate line GL. The gate line GL may be disposed between the device substrate 100 and the interlayer insulating layer 240.

The gate electrode 230 of the second thin film transistor TR2 may be electrically connected to the first thin film transistor TR1. For example, the first thin film transistor TR1 may transmit a data signal supplied through the data line DL to the gate electrode 230 of the second thin film transistor TR2 according to a gate signal supplied through the gate line GL. The source electrode 250 of the first thin film transistor TR1 may be electrically connected to the data line DL. The data line DL may include the same or substantially the same material as the source electrode 250 of the first thin film transistor TR1. For example, the source electrode 250 of the first thin film transistor TR1 may be a part of the data line DL. The data line DL may be disposed on the interlayer insulating layer 240.

The gate electrode 230 of the second thin film transistor TR2 may be electrically connected to the drain electrode 260 of the first thin film transistor TR1. For example, the second thin film transistor TR2 may electrically connect between the light-emitting device 300 and the power supply line PL according to the signal supplied from the first thin film transistor TR1. The source electrode 250 of the second thin film transistor TR2 may be electrically connected to the power supply line PL. The power supply line PL may include the same or substantially the same material as the source electrode 250 of the second thin film transistor TR2. For example, the source electrode 250 of the second thin film transistor TR2 may be a part of the power supply line PL. The power supply line PL may be disposed on the interlayer insulating layer 240. The power supply line PL may include the same or substantially the same material as the data line DL. For example, the power supply line PL may be disposed on the same layer as the data line DL.

A buffer layer 110 may be disposed between the device substrate 100 and the driving circuits. The buffer layer 110 may prevent pollution due to the device substrate 100 in the process of forming the driving circuits. The buffer layer 110 may extend behind the driving circuits. For example, the buffer layer 110 may extend between the device substrate 100 and the signal lines GL, DL and PL. The driving circuit of each unit pixel PA may be disposed on the buffer layer 110. A surface of the device substrate 100 toward the driving circuits may be entirely covered by the buffer layer 110. For example, the interlayer insulating layer 240 may be in contact with the buffer layer 110 at the outside of the driving circuits.

The buffer layer 110 may include a first buffer penetrating hole 111*h* overlapping with the data line DL, and a second buffer penetrating hole 112*h* overlapping with the power supply line PL. The interlayer insulating layer 240 may include a first interlayer penetrating hole 241*h* overlapping with the first buffer penetrating hole 111*h*, and a second interlayer penetrating hole 242*h* overlapping with the second buffer penetrating hole 112*h*.

A first penetrating hole PH1 may include the first buffer penetrating hole 111*h* and the first interlayer penetrating hole 241*h*. A second penetrating hole PH2 may include the second buffer penetrating hole 112*h* and the second interlayer penetrating hole 242*h*.

The data line DL may include a region in the first penetrating hole PH1. For example, a sidewall PHs of the first penetrating hole PH1 having a sidewall 111*s* of the first buffer penetrating hole 111*h* and a sidewall 241*s* of the interlayer penetrating hole 241*h* toward the second penetrating hole PH2 may be covered by the data line DL. A distance of the first penetrating hole PH1 in the second direction X may be smaller than a distance the data line DL in the second direction X. For example, the first penetrating hole PH1 may be disposed between device substrate 100 and the data line DL. The data line DL may extend along the sidewall PHs of the first penetrating hole PH1. The data line DL may be in contact with the device substrate 100 in the first penetrating hole PH1.

In one or more embodiments, the first penetrating hole PH1 may have a trapezoid shape in cross-section view, as shown in FIGS. 2B, 3. For example, the first penetrating hole PH1 has an inverted trapezoid shape in cross-section along the xz plane. Similarly, the second penetrating hole PH2 may also have a trapezoid cross-sectional shape (or an inverted trapezoid shape or an upside down trapezoid shape). A first buffer penetrating hole 111*h* and a first interlayer penetrating hole 241*h* may be part of the first penetrating hole PH1. In these cases, for some embodiments, both the first buffer penetrating hole 111*h* and a first interlayer penetrating hole 241*h* may have a trapezoid cross-section shape. Similarly, a second buffer penetrating hole 112*h* and a second interlayer penetrating hole 242*h* may have a trapezoid cross-section shape. In further embodiments, only one hole may have a trapezoid cross-section shape. For example, the first buffer penetrating hole 111*h* may have a trapezoid shape but the first interlayer penetrating hole 241*h* can have a different shape. Similarly, the second buffer penetrating hole 112*h* may have a trapezoid shape but the second interlayer penetrating hole 242*h* on the second buffer penetrating hole 112*h* can have a different shape.

The power supply line PL may include a region in the second penetrating hole PH2. For example, a sidewall of the second penetrating hole PH2 toward the first penetrating hole PH1 may be covered by the power supply line PL. A distance of the second penetrating hole PH2 in the second direction X may be smaller than a distance of the power supply line PL in the second direction X. For example, the second penetrating hole PH2 may be disposed between the device substrate 100 and the power supply line PL. The power supply line PL may extend along the sidewall of the second penetrating hole PH2. The power supply line PL may be in contact with the device substrate 100 in the second penetrating hole PH2.

A lower passivation layer 120 may be disposed on the driving circuits. The lower passivation layer 120 may prevent the damage of the driving circuits due to the external, foreign materials such as moisture and external impact. For example, the first thin film transistor TR1, the second thin film transistor TR2 and the storage capacitor Cst may be covered by the lower passivation layer 120. The lower passivation layer 120 may extend behind the driving circuits. For example, the signal lines GL, DL and PL may be covered by the lower passivation layer 120.

The lower passivation layer 120 may include an insulating material. For example, the lower passivation layer 120 may include an inorganic material. The lower passivation layer 120 may include a material different from the interlayer insulating layer 240. For example, the lower passivation layer 120 may include silicon nitride (SiN).

An over-coat layer 130 may be disposed on the lower passivation layer 120. The over-coat layer 130 may remove a thickness difference due to the driving circuits. For example, a surface of the over-coat layer 130 opposite to the device substrate 100 may be flat surface. The over-coat layer 130 may extend behind the driving circuits. For example, the over-coat layer 130 may extend along the lower passivation layer 120. A thickness difference due to the signal lines GL, DL and PL may be removed by the over-coat layer 130.

The over-coat layer 130 may include an insulating material. The over-coat layer 130 may include a material different from the lower passivation layer 120. For example, the over-coat layer 130 may include an organic material.

The light-emitting device 300 may be disposed on the over-coat layer 130. The light-emitting device 300 may emit light. For example, the light-emitting device 300 may include a first electrode 310, a light-emitting layer 320, and a second electrode 330, which may be sequentially stacked on the over-coat layer 130.

The first electrode 310 may include a conductive material. The first electrode 310 may include a transparent material. For example, the first electrode 310 may be a transparent electrode formed of a transparent conductive material, such as indium tin oxide (ITO) and indium zinc oxide (IZO).

The light-emitting layer 320 may generate light having luminance corresponding to a voltage difference between the first electrode 310 and the second electrode 330. For example, the light-emitting layer 320 may include an emission material layer (EML) having an emission material. The emission material may be an organic material. For example, the display apparatus according to the embodiment of the present disclosure is an organic light-emitting display device having an organic emission material.

The light-emitting layer 320 may have a multi-layer structure in order to increase luminous efficiency. For example, the light-emitting layer 320 may further include at least one of a hole injection layer (HIL), a hole transporting layer (HTL), an electron transporting layer (ETL), and an electron injection layer (EIL).

The second electrode 330 may include a conductive material. The second electrode 330 may include a material different from the first electrode 310. The second electrode 330 may have a reflectance higher than the first electrode 310. For example, the second electrode 330 may include a metal, such as aluminum (Al) and silver (Ag). Thus, in the display apparatus according to the embodiment of the present disclosure, the light generated by the light-emitting layer 320 of each light-emitting device 300 may be emitted to outside through the device substrate 100.

The light-emitting device 300 of each unit pixel PA may not overlap with the driving circuit of corresponding unit pixel PA. For example, each of the unit pixels PA may include an emitting region EA in which the corresponding light-emitting device 300 is disposed, and a driving region DA in which the corresponding driving circuit is disposed. The emitting region EA and the driving region DA may be disposed side by side. For example, each driving region DA may be disposed side by side with the corresponding emitting region EA in the first direction Y. Thus, in the display apparatus according to the embodiment of the present disclosure, the light emitted from the light-emitting device 300 of each unit pixel PA may be not blocked by the driving circuit of the corresponding unit pixel PA. Therefore, in the display apparatus according to the embodiment of the present disclosure, light extraction efficiency may be improved.

The light-emitting device 300 of each unit pixel PA may be electrically connected to the driving circuit of the corresponding unit pixel PA. For example, the lower passivation layer 120 and the over-coat layer 130 may respectively include a contact hole partially exposing the drain electrode 260 of the second thin film transistor TR2. The first electrode 310 of each light-emitting device 300 may be electrically connected to the drain electrode 260 of the corresponding second thin film transistor TR2.

The light-emitting device 300 of each unit pixel PA may be controlled, independently. For example, the first electrode 310 of each light-emitting device 300 may be spaced away from the first electrode 310 of adjacent light-emitting device 300. A bank insulating layer 140 may be disposed in a space between the adjacent first electrodes 310.

The bank insulating layer 140 may include an insulating material. For example, the bank insulating layer 140 may include an organic insulating material. The bank insulating layer 140 may include a material different from the over-coat layer 130.

The bank insulating layer 140 may be disposed on the over-coat layer 130. For example, the bank insulating layer 140 may cover an edge of each first electrode 310. The bank insulating layer 140 may form the emitting region EA of each unit pixel PA. For example, the light-emitting layer 320 and the second electrode 330 of each light-emitting device 300 may be stacked on a portion of the corresponding first electrode 310 exposed by the bank insulating layer 140. The bank insulating layer 140 may extend onto the driving region DA of each unit pixel PA. For example, the first thin film transistor TR1, the second thin film transistor TR2 and the storage capacitor Cst of each unit pixel PA may be disposed between the device substrate 100 and the bank insulating layer 140. The bank insulating layer 140 may extend behind each unit pixel PA. For example, the signal lines GL, DL and PL may overlap with the bank insulating layer 140.

The light-emitting device 300 of each unit pixel PA may emit light and display the same color as the light-emitting device 300 of adjacent unit pixels PA. For example, the light-emitting layer 320 of each light-emitting device 300 may extend on the bank insulating layer 140. The light-emitting layer 320 of each light-emitting device 300 may be coupled to the light-emitting layer 320 of adjacent light-emitting devices 300. The second electrode 330 may extend along the light-emitting layer 320. For example, the second electrode 330 of each light-emitting device 300 may be coupled to the second electrode 330 of adjacent light-emitting devices 300. The second electrode 330 may function as a common electrode layer.

A color filter 400 may be disposed between the device substrate 100 and the light-emitting device 300. The light by the light-emitting device 300 may be emitted to outside through the color filter 400. Each of the unit pixels PA may display a color different from adjacent unit pixel PA by the color filter 400. For example, the color filter 400 disposed in each unit pixel PA may include a material different from the color filter 400 disposed in adjacent unit pixel PA.

The color filter 400 may be disposed on a path of the light emitted from the corresponding light-emitting device 300. For example, the color filter 400 may overlap the corresponding light-emitting device 300. The color filter 400 may be disposed between the lower passivation layer 120 and the over-coat layer 130. A thickness difference due to the color filter 400 may be reduced or removed by the over-coat layer 130.

The light-emitting device 300 and the color filter 400 may overlap a region between the data line DL and the power supply line PL. Thus, in the display apparatus according to the embodiment of the present disclosure, the light Lc traveling in the direction of adjacent unit pixels PA after passing through the color filter 400 of the corresponding unit pixel PA may be reflected inwardly of the corresponding unit pixel PA by a portion of the data line DL which is disposed in the first penetrating hole PH1, and a portion of the power supply line PL which is disposed in the second penetrating hole PH2. Therefore, in the display apparatus according to the embodiment of the present disclosure, the quality deterioration of the image due to mixing color may be prevented. Furthermore, in the display apparatus according to the embodiment of the present disclosure, the light extraction efficiency of each unit pixel PA may be increased or maximized.

A distance of the first penetrating hole PH1 in the first direction Y and a distance of the second penetrating hole PH2 in the first direction Y may be smaller than a distance of each unit pixel PA in the first direction Y. For example, the first penetrating hole PH1 and the second penetrating hole PH2 may be not formed under a portion of the data line DL and a portion of the power supply line PL which are disposed side by side with the driving region DA of each unit pixel PA. The first penetrating hole PH1 and the second penetrating hole PH2 may not overlap with the gate line GL. For example, the gate line GL may not intersect or overlap the first penetrating hole PH1 and the second penetrating hole PH2. Thus, in the display apparatus according to the embodiment of the present disclosure, the insulation between the data line DL and the power supply line PL which are extended in the first direction Y, and the gate line GL extending in the second direction X may be maintained.

A distance of the second penetrating hole PH2 in the first direction Y may be substantially the same as a distance of the first penetrating hole PH1 in the first direction Y. Thus, in the display apparatus according to the embodiment of the present disclosure, the luminance deviation due to the difference between the light reflected by the data line DL and the light reflected by the power supply line PL may be prevented. Therefore, in the display apparatus according to the embodiment of the present disclosure, the quality deterioration of the realized image may be effectively prevented.

An upper passivation layer 150 may be disposed on the light-emitting device 300. The upper passivation layer 150 may prevent the damage of the light-emitting device 300 due to the external moisture and impact. The upper passivation layer 150 may extend along the second electrode 330 of the light-emitting device 300. For example, the upper passivation layer 150 on each unit pixel PA may be coupled to the upper passivation layer 150 on adjacent unit pixel PA.

The upper passivation layer 150 may include an insulating material. For example, the upper passivation layer 150 may include an inorganic insulating material. For example, the upper passivation layer 150 may include silicon oxide (SiO) or silicon nitride (SiN).

An encapsulation substrate 500 may be disposed on the upper passivation layer 150. The encapsulation substrate 500 may include an insulating material. The encapsulation substrate 500 may provide a path for radiating heat which is generated by the operation of the light-emitting device 300 or the driving circuit of each unit pixel PA. The encapsulation substrate 500 may include a material having a higher thermal conductivity than the device substrate 100. For example, the encapsulation substrate 500 may include a metal, such as aluminum (Al), iron (Fe), and nickel (Ni).

An encapsulating layer 600 may be disposed between the upper passivation layer 150 and the encapsulation substrate 500. The encapsulation substrate 500 may be coupled to the device substrate 100 in which the light-emitting device 300 is formed, by the encapsulating layer 600.

The encapsulating layer 600 may include an insulating material. The encapsulating layer 600 may include a curable material. For example, the encapsulating layer 600 may include a thermosetting resin.

The encapsulating layer 600 may deter or delay the penetration of the external moisture. For example, the encapsulating layer 600 may include moisture-absorbing particles. The encapsulating layer 600 may have a multi-layer structure. For example, the encapsulating layer 600 may include a lower encapsulating layer and an upper encapsulating layer, which are sequentially stacked on the upper passivation layer 150. The moisture-absorbing particles may be dispersed in the upper encapsulating layer. Thus, in the display apparatus according to the embodiment of the present disclosure, the stress applied to the light-emitting device 300 due to the expansion of the moisture-absorbing particles may be relieved by the lower encapsulating layer.

Accordingly, in the display apparatus according to the embodiment of the present disclosure, an insulating element between the device substrate 100 and the light-emitting device 300, such as the buffer layer 110 and interlayer insulating layer 240, may include penetrating holes PH1 and PH2 overlapping with the signal lines which are disposed side by side with the emitting region EA of each unit pixel PA, such as the data line DL and the power supply line PL. Each of the signal lines may include a portion in the corresponding penetrating hole PH1 and PH2. Thus, in the display apparatus according to the embodiment of the present disclosure, the light traveling in the direction of adjacent unit pixel PA from the each unit pixel PA may be reflected inwardly of the corresponding unit pixel PA by the portions of the signal lines which are disposed in the penetrating hole PH1 and PH2 of the insulating element. Therefore, in the display apparatus according to the embodiment of the present disclosure, the quality deterioration of the image due to mixing color may be prevented, and the light extraction efficiency may be improved.

Figure 4:
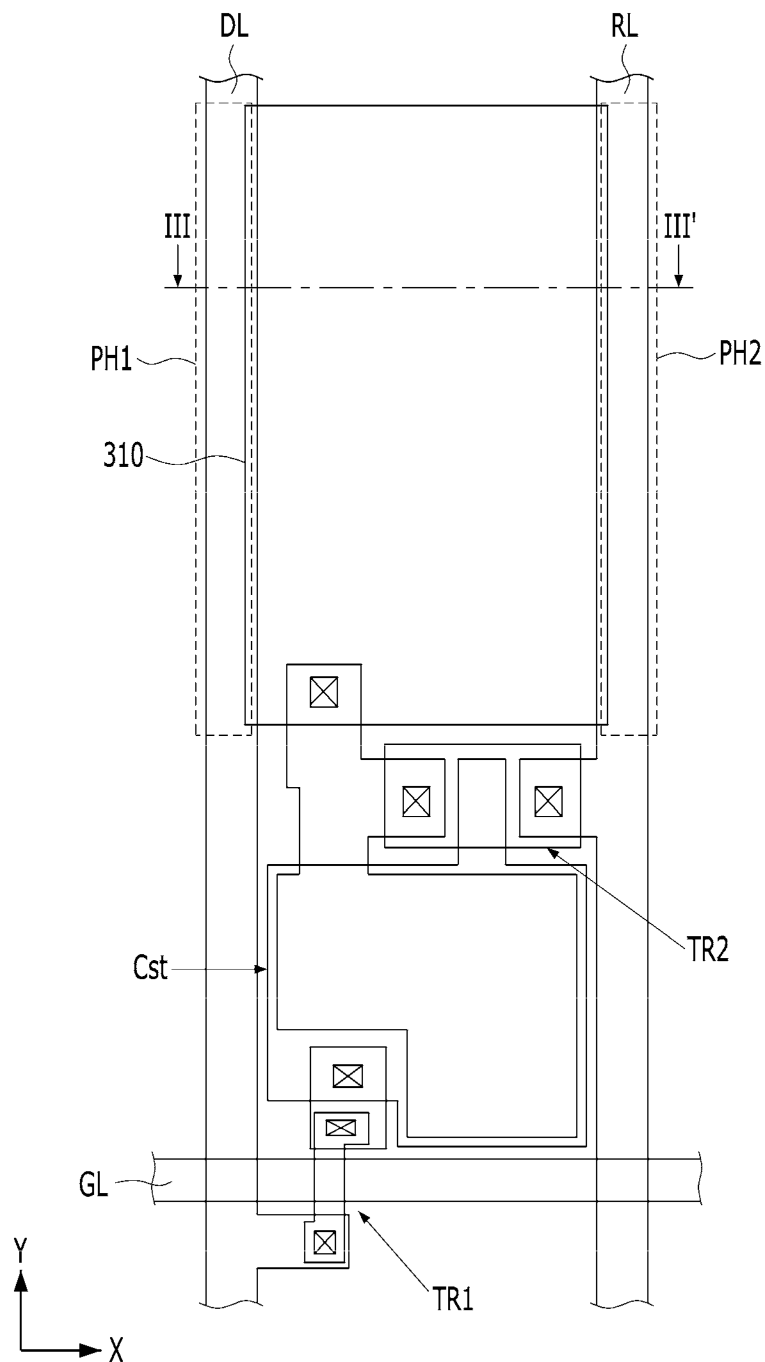
FIGS. 4, 6, 7A, 7B, 8A, 8B, 9 and 12 are views respectively showing the display apparatus according to another embodiment of the present disclosure.
Figure 5:
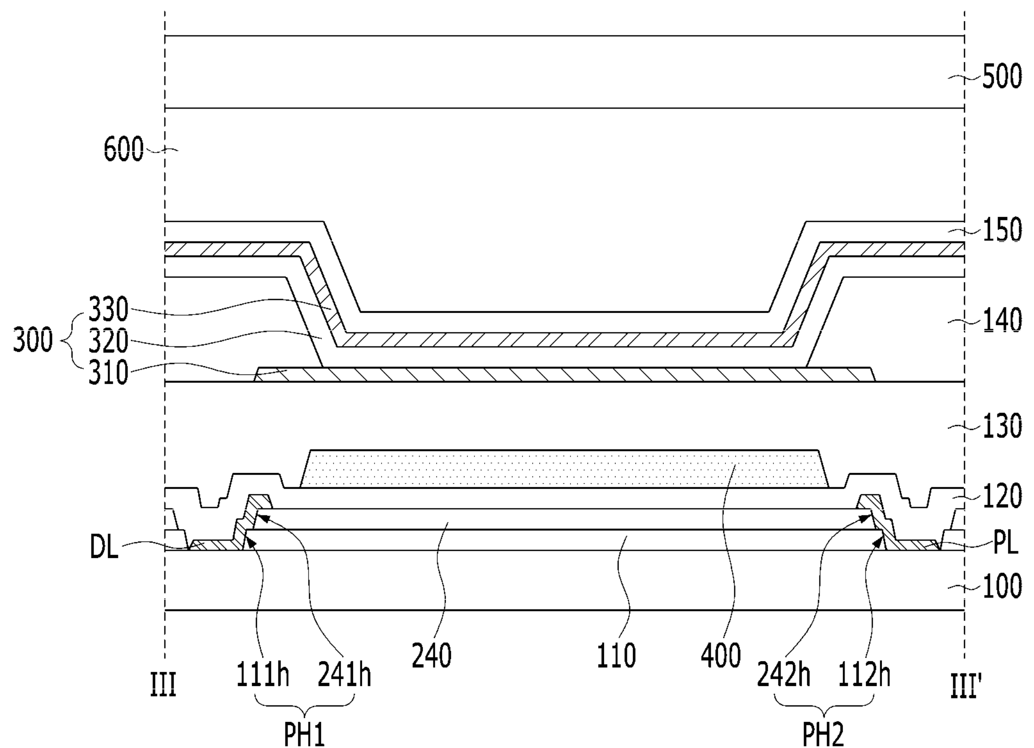
FIG. 5 is a view taken along III-III' of FIG. 4.

The display apparatus according to the embodiment of the present disclosure is described that each of the penetrating holes PH1 and PH2 completely overlaps the corresponding signal line, such as the data line DL or the power supply line PL, so that both end portions of each signal line are disposed outside of the corresponding penetrating hole PH1 and PH2. However, in the display apparatus according another embodiment of the present disclosure, the distance of each penetrating hole in the second direction may be larger than the distance of the corresponding signal line in the second direction. For example, in the display apparatus according to another embodiment of the present disclosure, an end portion of the data line DL opposite to the emitting region EA may be disposed in the first penetrating hole PH1, and an end portion of the power supply line PL opposite to the emitting region EA may be disposed in the second penetrating hole PH2, as shown in FIGS. 4 and 5. Thus, in the display apparatus according to another embodiment of the present disclosure, the insulation between adjacent data line DL and power supply line PL may be improved.

The display apparatus according to another embodiment of the present disclosure is described that an outer end portion of each signal line is disposed in the corresponding penetrating hole PH1 and PH2. However, in the display apparatus according to another embodiment of the present disclosure, the signal line which is disposed near a side of the emitting region EA of each unit pixel PA, for example the data line DL may include an outer end portion which is disposed in the corresponding penetrating hole PH1 and PH2. Thus, in the display apparatus according to another embodiment of the present disclosure, an end portion of the data line DL and an end portion of the power supply line PL toward the end portion of adjacent data line DL may be disposed on different layers. Therefore, in the display apparatus according to another embodiment of the present disclosure, the insulation between adjacent data line DL and power supply line PL may be effectively improved.

Figure 6:
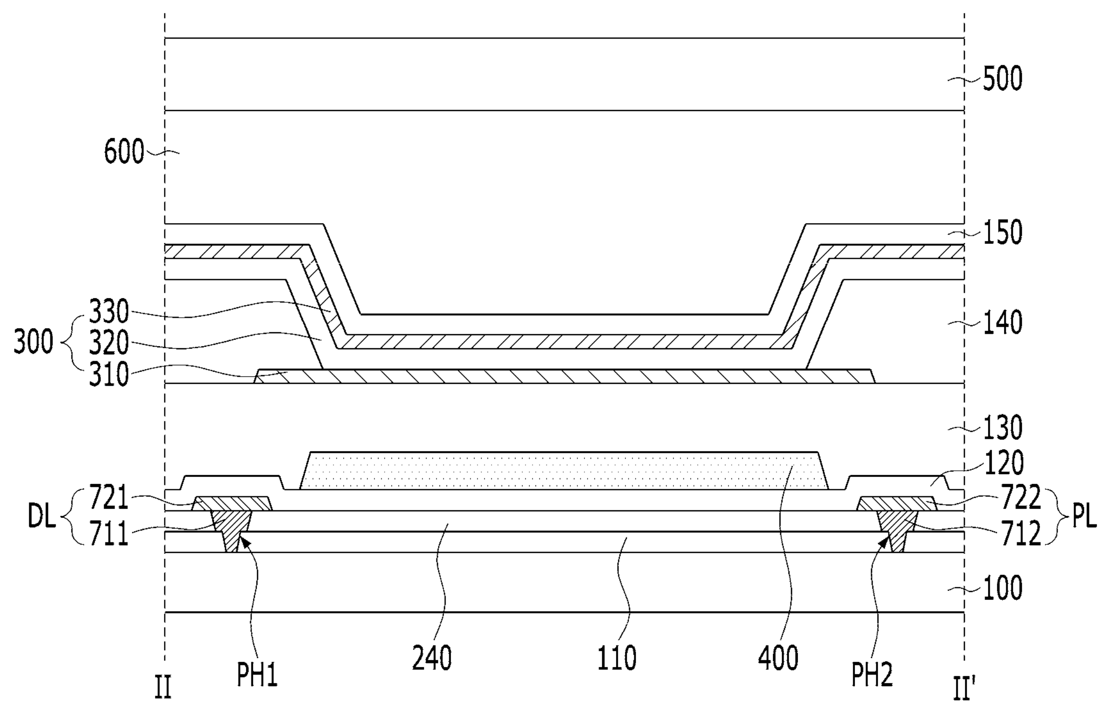

The display apparatus according to the embodiment of the present disclosure is described that a portion of the signal line DL and PL which is disposed in each penetrating hole PH1 and PH2 may extend along at least one sidewall of the corresponding penetrating hole PH1 and PH2. However, in the display apparatus according to another embodiment of the present disclosure, a portion of the signal line DL and PL overlapping with each penetrating hole PH1 and PH2 may have a thickness different from another portion of the corresponding signal line. For example, in the display apparatus according to another embodiment of the present disclosure, the data line DL and the power supply line PL may respectively include a first region 711 and 712 in the corresponding penetrating hole PH1 and PH2, and a second region 721 and 722 on the corresponding first region 711 and 712, as shown in FIG. 6. The first region 711 and 712 may be thicker than the second region 721 and 722 of the corresponding signal line DL and PL. For example, the first region 711 and 712 of each signal line DL and PL may completely fill the corresponding penetrating hole PH1 and PH2. The second region 721 and 722 may include a material different from the first region 711 and 712 of the corresponding signal line DL and PL. For example, the first region 711 and 712 of the corresponding signal line DL and P1 may include a material having a higher reflectance than the second region 721 and 722 of the corresponding signal line DL and PL. Thus, in the display apparatus according to another embodiment of the present disclosure, the delay of the signal applied through the signal lines GL, DL and PL may be prevented, and the light traveling in the direction of adjacent unit pixel PA from each unit pixel PA may be effectively reflected. Therefore, in the display apparatus according to another embodiment of the present disclosure, the quality deterioration of the image may be effectively prevented.

Figure 7A:
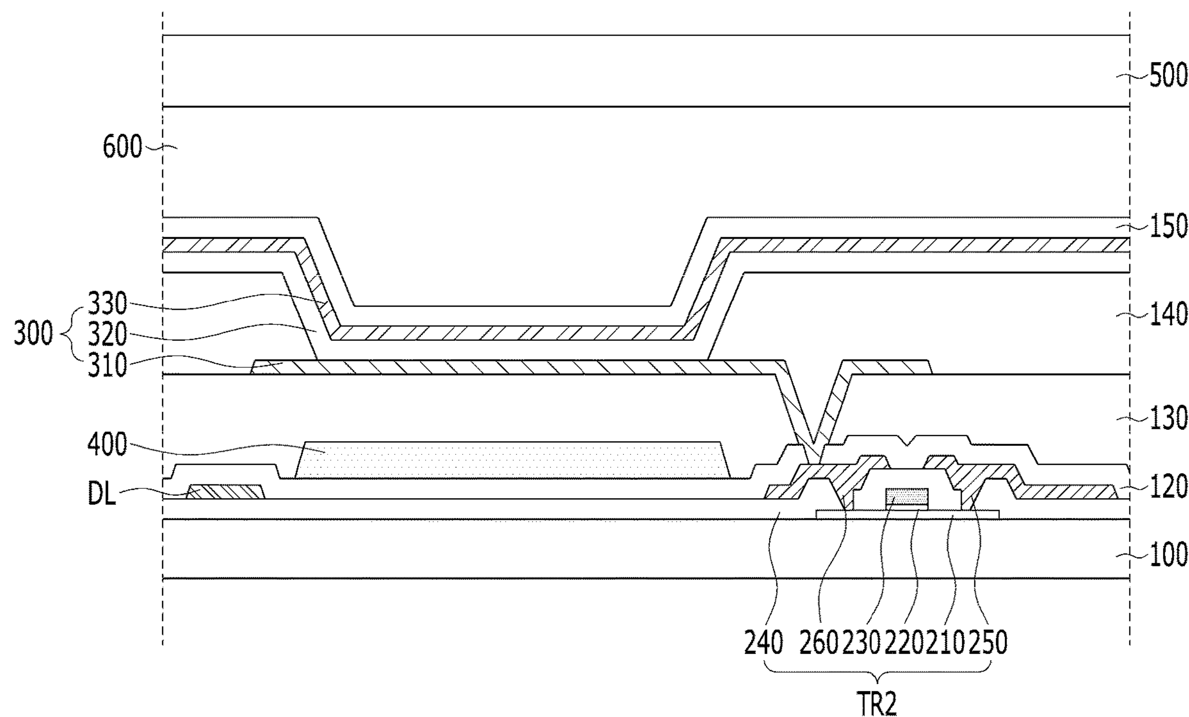
Figure 7B:
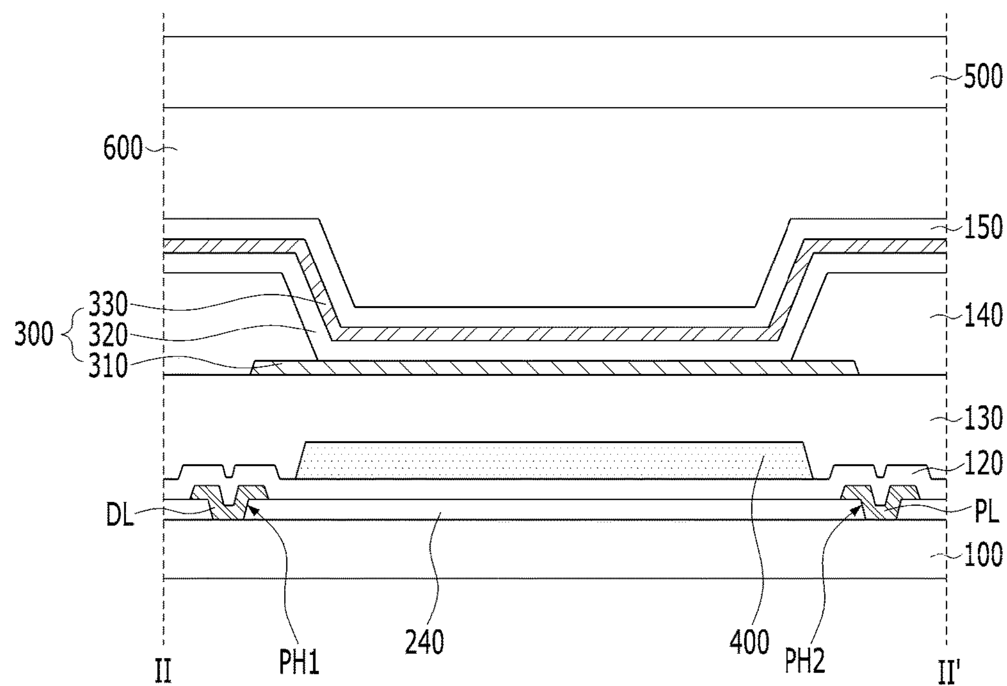
Figure 8A:
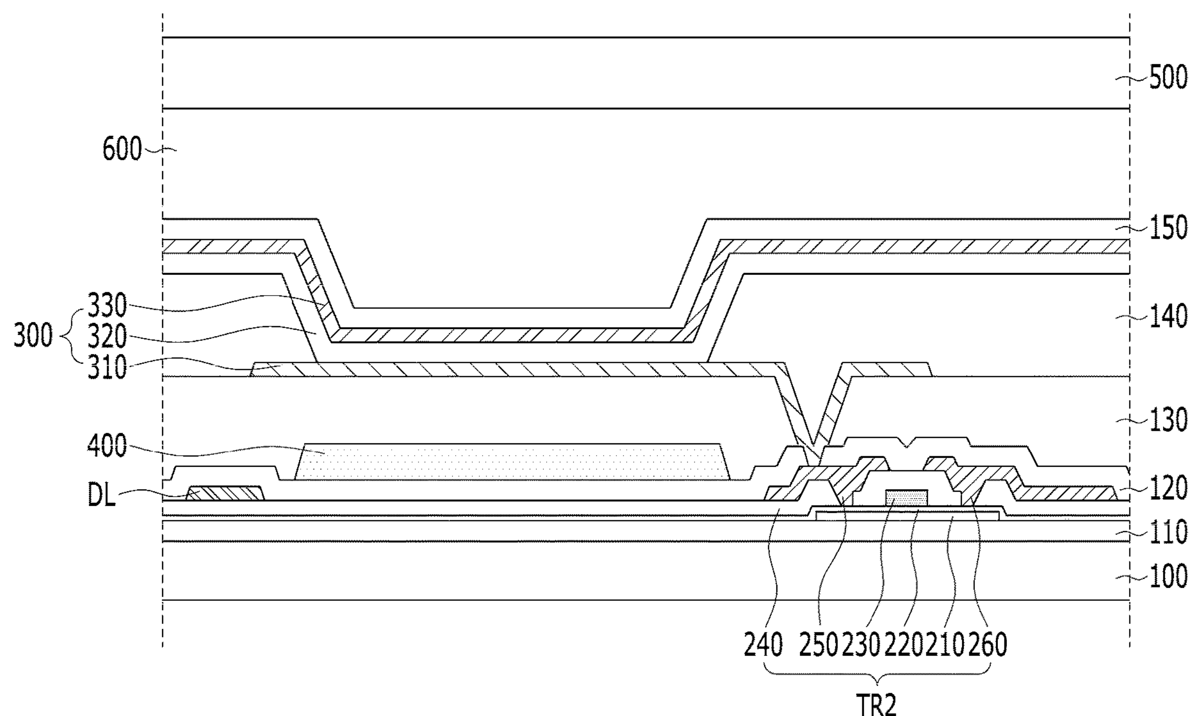
Figure 8B:
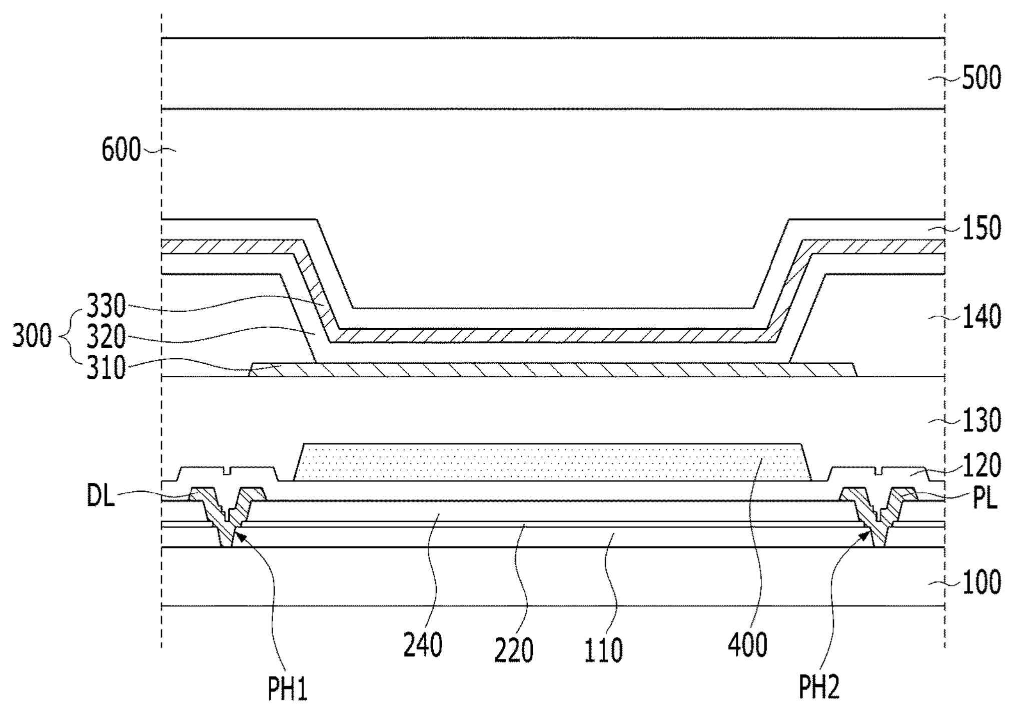

The display apparatus according to the embodiment of the present disclosure is described that the penetrating holes PH1 and PH2 for preventing mixing of color may penetrate two insulating layer, such as the buffer layer 110 and the interlayer insulating layer 240. However, in the display apparatus according to another embodiment of the present disclosure, at least one insulating layer may be disposed between the device substrate 100 and the signal lines DL and PL which are extended in the first direction Y. For example, in the display apparatus according to another embodiment of the present disclosure, the semiconductor pattern 210 may be in contact with the device substrate 100, as shown in FIGS. 7A and 7B. Alternatively, in the display apparatus according to another embodiment of the present disclosure, the gate insulating layer 240 may extend between the buffer layer 110 and the interlayer insulating layer 240, as shown in FIGS. 8A and 8B. Thus, in the display apparatus according to another embodiment of the present disclosure, the first penetrating hole PH1 and the second penetrating hole PH2 may be formed in the interlayer insulating layer 240, or the first penetrating hole PH1 and the second penetrating hole PH2 may penetrate the buffer layer 110, the gate insulating layer 220 and the interlayer insulating layer 240. That is, in the display apparatus according to another embodiment of the present disclosure, the insulating element having at least one insulating layer between the device substrate 100 and the signal lines DL and PL extending in the first direction Y may include penetrating holes PH1 and PH2 which are disposed side by side with the emitting region EA of each unit pixel PA in the second direction X, and the signal lines DL and PL extending in the first direction Y may respectively include a portion in the corresponding penetrating hole PH1 and PH2. Thus, in the display apparatus according to another embodiment of the present disclosure, the degree of freedom for the construction of the driving circuit between the device substrate 100 and the light-emitting device 300 may be improved.

Figure 9:
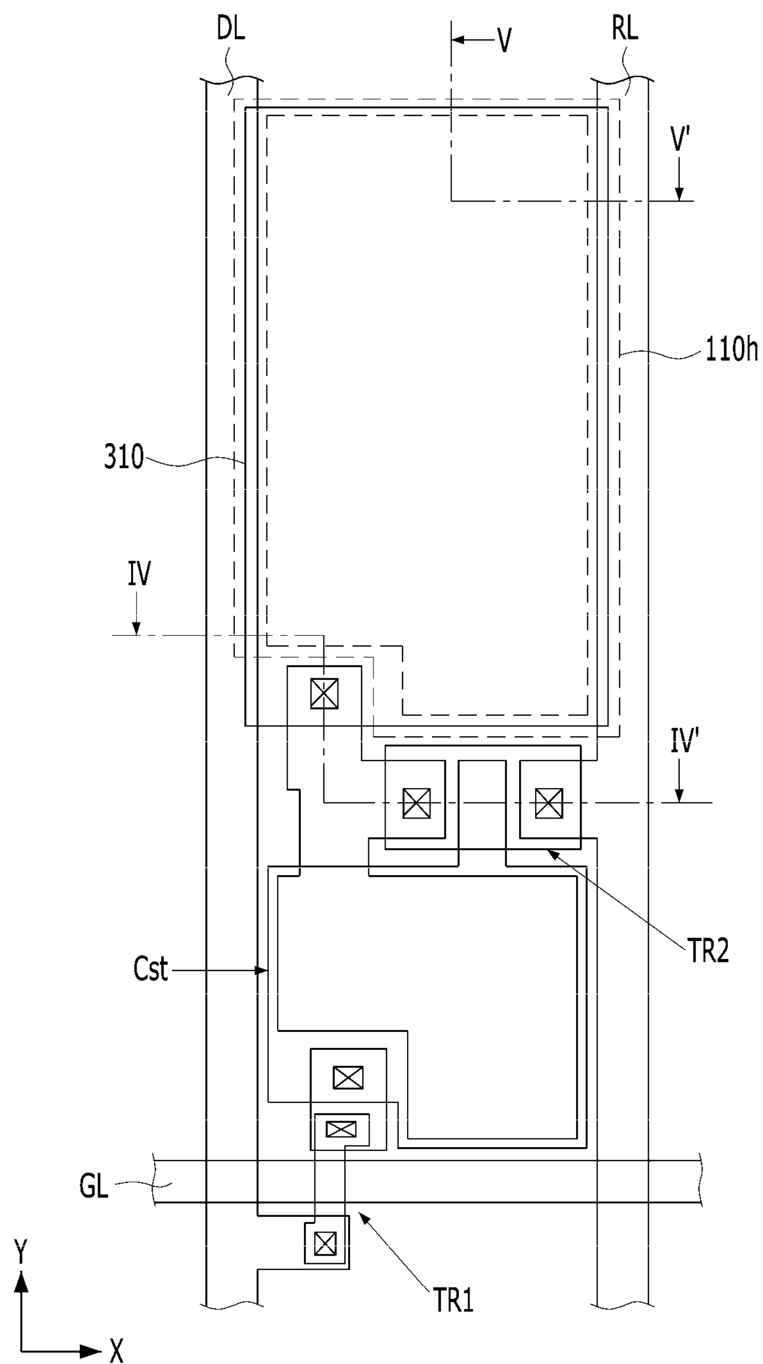
Figure 10:
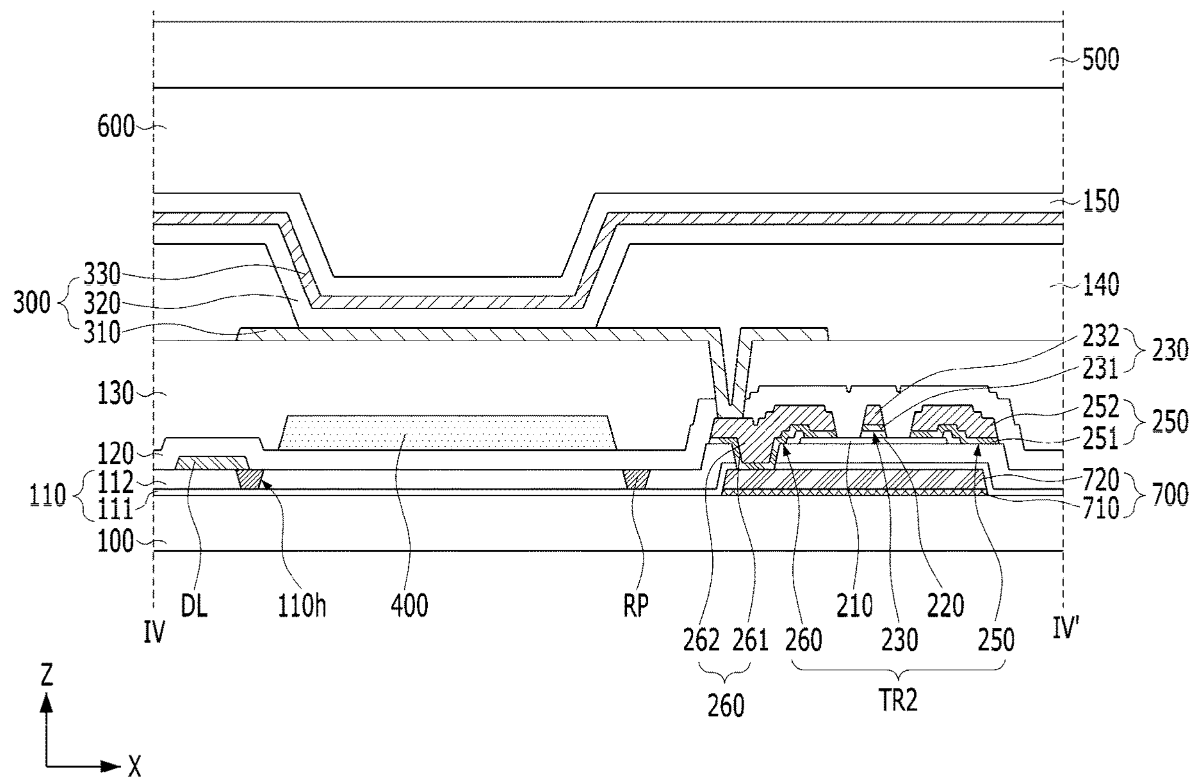
FIG. 10 is a view taken along IV-IV' of FIG. 9.
Figure 11:
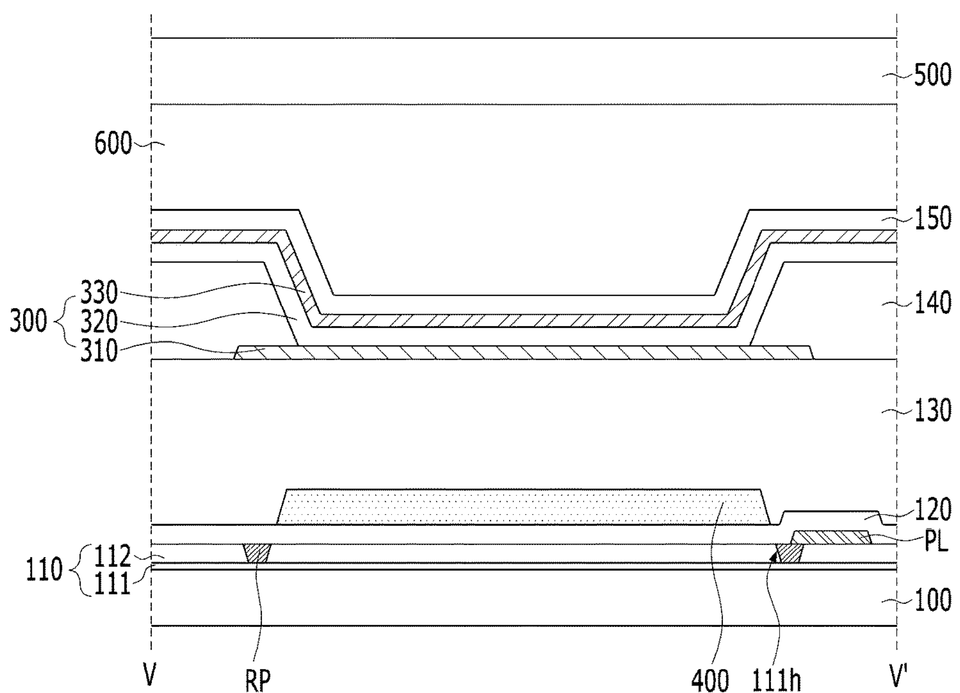
FIG. 11 is a view taken along V-V' of FIG. 9.

The display apparatus according to the embodiment of the present disclosure is described that the penetrating holes PH1 and PH2 extending in the first direction Y for preventing mixing of color may be spaced away in the second direction X. However, the display apparatus according another embodiment of the present disclosure may include a mixing preventing hole 110*h* having closed loop shape, and a reflective pattern RP in the mixing preventing hole 110*h*, as shown in FIGS. 9 to 11. For example, the mixing preventing hole 110*h* may extend along an edge of the first electrode 310. The mixing preventing hole 110*h* may bypass the contact hole for connecting the light-emitting device to the second thin film transistor TR2. For example, the mixing preventing hole 110*h* may be a polygonal shape.

The mixing preventing hole 110*h* may penetrate at least one insulating layer between the device substrate 100 and the data line DL. For example, in the display apparatus according another embodiment of the present disclosure, the buffer layer 110 covering a blocking element 700 on the device substrate 100 may have a stacked structure of a first buffer layer 111 and a second buffer layer 112, and the mixing preventing hole 110*h* may penetrating the second buffer layer 112. The second buffer layer 112 may include a material different from the first buffer layer 111. For example, the second buffer layer 112 may be thicker than the first buffer layer 111.

The blocking element 700 may block the light traveling in the direction of the semiconductor pattern 210 passing through the device substrate 100. For example, the blocking element 700 may include metal. The blocking element 700 may have a multi-layer structure. For example, the blocking element 700 may include a first blocking layer 710 and a second blocking layer 720, which are sequentially stacked on the device substrate 100. The second blocking layer 720 may include a material different from the first blocking layer 710.

The reflective pattern RP may include a region overlapping with the data line DL, and a region overlapping with the power supply line PL. The reflective pattern RP may include a conductive material. For example, the reflective pattern RP may include a metal, such as aluminum (Al), chrome (Cr), molybdenum (Mo) and tungsten (W). The reflective pattern RP may include a material different from the data line DL and the power supply line PL. The reflective pattern RP may completely fill the mixing preventing hole 110*h*. For example, an upper surface of the reflective pattern RP opposite to the device substrate 100 may be coplanar with an upper surface of the buffer layer 110 toward the light-emitting device 300.

The reflective pattern RP may include a region contacting the data line DL, and a region contacting the power supply line PL. For example, in the display apparatus according another embodiment of the present disclosure, the second thin film transistor TR2 may not include the interlayer insulating layer 240. The gate electrode 230 of the second thin film transistor TR2 may have the same or substantially the same structure as the source electrode 250 and the drain electrode 260 of the second thin film transistor TR2. For example, in the display apparatus according another embodiment of the present disclosure, a method of forming the second thin film transistor TR2 may include a process of forming the gate insulating layer 220 covering the channel region and end portions of the semiconductor pattern 210, and a process of forming the gate electrode 230, the source electrode 250 and the drain electrode 260 on the gate insulating layer 220, at the same or substantially the same time. The gate electrode 230, the source electrode 250 and the drain electrode 260 may respectively include a first electrode layer 231, 251 and 261, and a second electrode layer 232, 252 and 262, which are sequentially stacked. The first electrode layer 231 of the gate electrode 230 may include the same or substantially the same material as the first electrode layer 251 of the source electrode 250 and the first electrode 261 of the drain electrode 260. The second electrode layer 232 of the gate electrode 230 may include the same or substantially the same material as the second electrode layer 252 of the source electrode 250 and the second electrode 262 of the drain electrode 260. The first electrode layer 231, 251 and 261 may include a material different from the second electrode 232, 252 and 262. For example, the second electrode layer 232, 252 and 262 may have a thickness different from the first electrode layer 231, 251 and 261. The source electrode 250 may be in direct contact with the source region of the semiconductor pattern 210 exposed by the gate insulating layer 220, and the drain electrode 260 may be in direct contact with the drain region of the semiconductor pattern 210 exposed by the gate insulating layer 220.

The drain electrode 260 may be connected to the blocking element 700. For example, the buffer layer 110 may include buffer contact hole exposing a portion of the blocking element 700. The drain electrode 260 may be in direct contact with the blocking element 700 in the buffer contact hole.

Thus, in the display apparatus according another embodiment of the present disclosure, the light traveling in the direction of adjacent unit pixel from each unit pixel may be effectively reflected without the construction of the driving circuit including the second thin film transistor TR2. Therefore, in the display apparatus according another embodiment of the present disclosure, the quality deterioration of the image may be effectively prevented.

Figure 12:
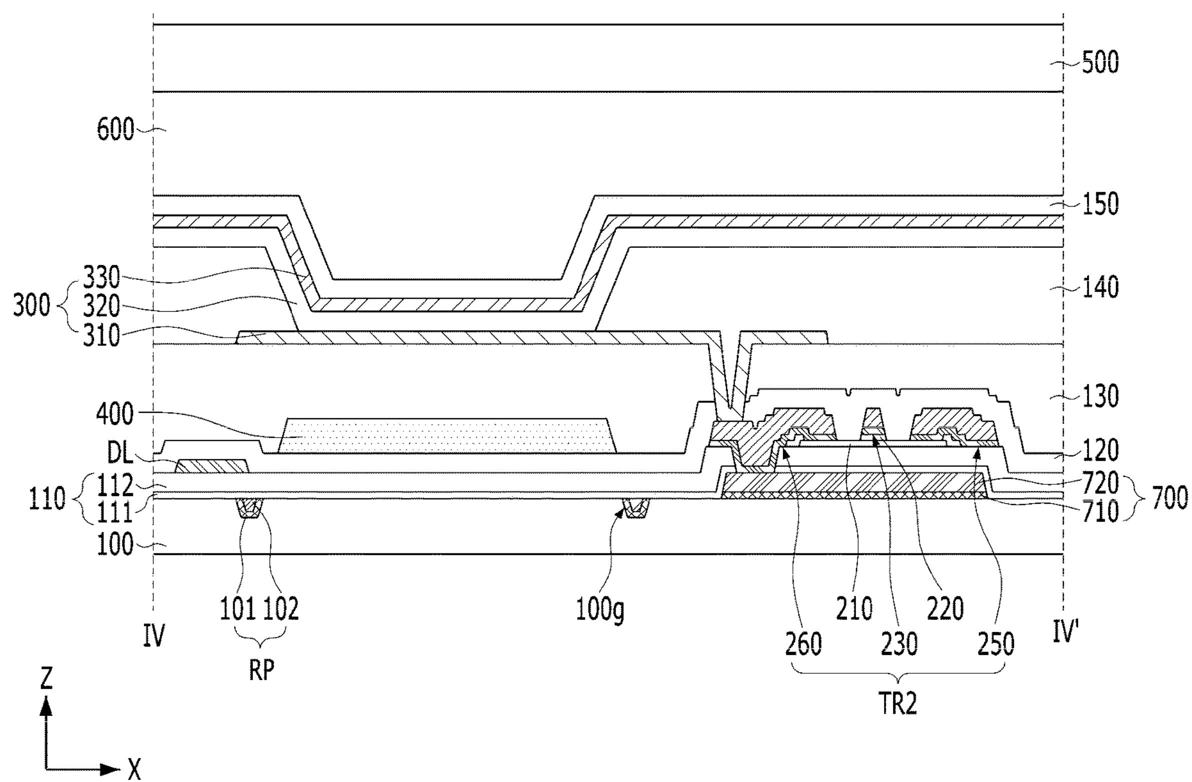

The display apparatus according to another embodiment of the present disclosure may include a mixing preventing groove 100*g* and a reflective pattern RP filling the mixing preventing groove 100*g*, as shown in FIG. 12. The mixing preventing groove 100*g* may be formed in the device substrate 100. The mixing preventing groove 100*g* may be a closed loop shape. The reflective pattern RP may be formed at the same or substantially the same time as the blocking element 700. For example, the reflective pattern RP may have a stacked structure of a first reflective layer 101 and a second reflective layer 102. The first reflective layer 101 may include the same or substantially the same material as the first blocking layer 710. The second reflective layer 102 may include the same or substantially the same material as the second blocking layer 720. The second reflective layer 102 may include a material different from the first reflective layer 101. The first reflective layer 101 may extend along a surface of the mixing preventing groove 100*g*. An upper surface of the reflective pattern RP toward the light-emitting device 300 may be in direct contact with the buffer layer 110. For example, the upper surface of the reflective pattern RP may be coplanar with an upper surface of the device substrate 100 toward the light-emitting device 300. Thus, in the display apparatus according another embodiment of the present disclosure, the process of forming the reflective pattern RP may not be affected by the process of forming the driving circuits. Therefore, in the display apparatus according another embodiment of the present disclosure, the degree of freedom for the construction of the driving circuit between the device substrate 100 and the light-emitting device 300 may be improved.

In the result, the display apparatus according to the embodiments of the present disclosure may include the penetrating hole between the signal lines disposed adjacent the light-emitting device and the device substrate supporting the light-emitting device, wherein each of the signal lines includes a portion in the corresponding penetrating hole. Thus, in the display apparatus according to the embodiments of the present disclosure, the light traveling in the direction of adjacent unit pixel from each light-emitting device may be blocked by the signal lines. Therefore, in the display apparatus according to the embodiments of the present disclosure, the quality deterioration of the image due to mixing of color may be prevented.

The various embodiments described above can be combined to provide further embodiments. Further changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus, comprising:

a substrate, a plurality of reflective patterns disposed overlying the substrate, an over coat layer covering the reflective patterns, a light-emitting element between the reflective patterns on the over coat layer, the light-emitting element comprising a first electrode, an organic light emitting layer, and a second electrode, wherein each of the reflective patterns includes a portion overlapping with an edge of the first electrode, and the light emitted from the light-emitting element is reflected by the reflective patterns toward a region of the substrate overlapping with the light-emitting element.

2. The display device according to claim 1, further comprising a color filter between the over coat layer and the light-emitting element, and between the reflective patterns.

3. The display device according to claim 1, further comprising an insulating layer between the substrate and the over coat layer, wherein the insulating layer having a first hole and a second hole spaced apart from the first hole, and wherein the reflective patterns are disposed in the first hole and the second hole.

4. The display device according to claim 3, wherein the first hole and the second hole extend along the edge of the first electrode, the second hole contacts the first hole, and the first hole and the second hole have a polygonal shape.

5. The display device according to claim 3, further comprising signal lines between the insulating layer and the over coat layer, wherein each of the reflective patterns includes a first portion being in contact with one of the signal lines.

6. The display device according to claim 5, wherein a second portion of each reflective pattern being spaced away from the signal lines is disposed closer to the light-emitting element than the first portion of the corresponding reflective pattern.

7. The display device according to claim 5, wherein an upper surface of each reflective pattern is coplanar with a surface of the insulating layer toward the light-emitting element.

8. The display device according to claim 5, wherein the signal lines include a material different from the reflective patterns.

9. A display device comprising:

a substrate including a plurality of grooves;

a light-emitting element on the substrate, the light-emitting element between the grooves;

first reflective layers disposed in the grooves of the substrate;

a thin film transistor on the substrate, the thin film transistor being spaced from the light-emitting element; and a blocking element between the substrate and the thin film transistor, the blocking element including a material;

wherein a side surface of each groove toward the light-emitting element is covered by one of the first reflective layers, and wherein the first reflective layers include a material that is the same material as the material included in the blocking element.

10. The display device according to claim 9, wherein the grooves are in contact with each other to form a closed loop shape.

11. The display device according to claim 9, further comprising second reflective layers on the first reflective layers, wherein each of the grooves is completely filled by the one of the first reflective layers and one of the second reflective layers.

12. The display device according to claim 11, wherein the second reflective layers include a material different from the first reflective layers.

13. The display device according to claim 11, an upper surface of each first reflective layer and an upper surface of each second reflective layer are coplanar with a surface of the substrate toward the light-emitting element.

14. The display device according to claim 9, further comprising a buffer layer between the blocking element and the thin film transistor, the buffer layer extending between the substrate and the light-emitting element, wherein each of the first reflective layers includes a portion being in contact with a lower surface of the buffer layer toward the substrate.

15. A display device comprising:

a substrate including a plurality of grooves;

a buffer layer on the substrate;

a light-emitting element on the buffer layer and being disposed between the grooves; and a reflective layer disposed in the grooves of the substrate under the buffer layer;

wherein the light-emitting element comprises a first electrode, an organic light emitting layer, and a second electrode, and wherein a portion of the reflective layer overlaps with an edge of the first electrode.

* * * * *